United States Patent [19]

Saller et al.

[11] Patent Number: 4,757,275
[45] Date of Patent: Jul. 12, 1988

[54] WIDEBAND CLOSED LOOP AMPLIFIER

[75] Inventors: Kenneth R. Saller; Michael A. Steffes, both of Fort Collins, Colo.

[73] Assignee: Comlinear Corporation, Fort Collins, Colo.

[21] Appl. No.: 123,122

[22] Filed: Nov. 20, 1987

[51] Int. Cl.[4] .............................................. H03F 3/45
[52] U.S. Cl. .................................... 330/261; 330/257
[58] Field of Search ................ 330/252, 255, 257, 261

[56] References Cited

U.S. PATENT DOCUMENTS 4,595,883 6/1986 Nakayama .................... 330/257 X

Primary Examiner—Eugene R. LaRoche
Assistant Examiner—Steven J. Mottola
Attorney, Agent, or Firm—Dean P. Edmundson

[57] ABSTRACT

A wideband closed loop amplifier is described which has improved accuracy over prior amplifiers. The closed loop amplifier includes (a) first and second differential amplifiers, (b) floating bias means connected between the output terminals of the first and second differential amplifiers, (c) an output stage including first and second output transistors; and (d) first and second bias sources connected to the collector terminals of the respective output transistors.

13 Claims, 7 Drawing Sheets

WIDEBAND CLOSED LOOP AMPLIFIER

FIELD OF THE INVENTION

This invention relates to buffer amplifiers. More particularly, this invention relates to a closed loop buffer topology that offers improvement over prior art buffers.

BACKGROUND OF THE INVENTION

Buffers are general-purpose building blocks that are used extensively in electronic circuits. Ideally, a buffer has infinite input impedance, zero output impedance, and a voltage gain of 1 over all frequencies. The most popular form is an open loop buffer, which offers very wide bandwidth, high slew rate, high output drive current, and several other features, and uses the fewest number of parts. Open loop buffers have a major drawback, however, in the area of accuracy. The invention provides a buffer that offers improved accuracy over prior art buffers, yet maintains most of the benefits of the open loop buffers.

SUMMARY OF THE INVENTION

In accordance with the present invention there is provided a closed loop buffer amplifier having significant advantages over prior art open loop buffer amplifiers and closed loop amplifiers. The closed loop buffer amplifier of the invention comprises:
(a) first and second differential amplifiers, each of which includes an inverting input and a non-inverting input and an output;
(b) floating bias means connected between the output terminals of the first and second differential amplifiers;
(c) an output stage comprising first and second output transistors each biasing base, emitter and collector terminals;
(d) first and second bias sources; wherein the first bias source is connected to the collector terminal of the first output transistor; wherein the second bias source is connected to the collector terminal of the second output transistor.

The non-inverting inputs of the first and second differential amplifiers are connected together to form the input terminal of the closed loop buffer amplifier. The inverting inputs of the first and second differential amplifiers are connected together to form the output terminal of the closed loop buffer amplifier. The emitter terminals of the first and second output transistors are connected to the output terminal of the closed loop buffer amplifier; the output of the first differntial amplifier is connected to the base terminal of the first output transistor; and the output of the second differential amplifier is connected to the base terminal of the second output transistor.

The various advantages of the closed loop buffer amplifier of the invention will be apparent from the following detailed description.

BRIEF DESCRIPTION OF THE DRAWING

The invention is described in more detail hereinafter with reference to the accompanying drawings wherein like reference characters refer to the same parts throughout the several views and in which.

DETAILED DESCRIPTION OF THE ILLUSTRATED EMBODIMENTS

Figure 1:
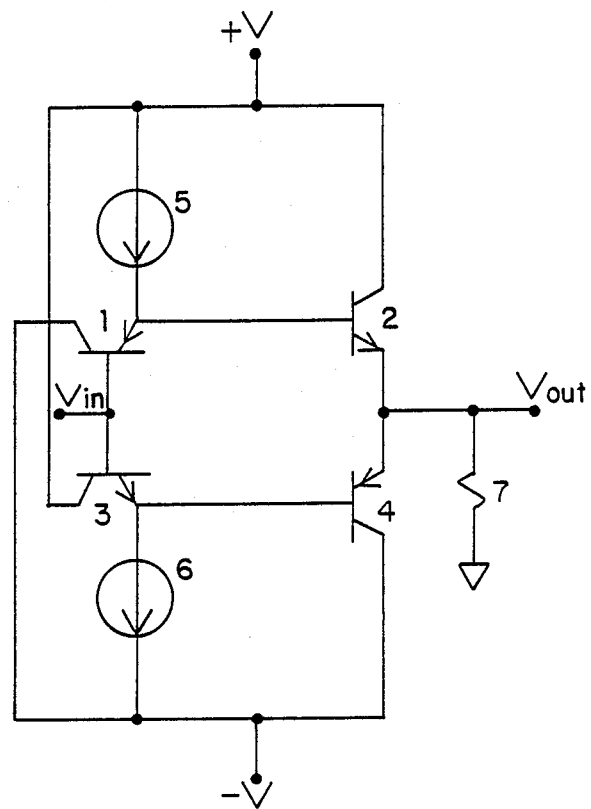
FIG. 1 illustrates a prior art open loop buffer amplifier.

The circuit shown in FIG. 1 is an open loop buffer amplifier known in the art. The output voltage, Vout, tracks the input voltage, Vin, as the input voltage is varied. The current delivered to the load, 7, is supplied by transistors 2 or 4, depending on a positive or negative output swing. The output impedance of this buffer, Ro, is given by $$Ro = Vt/(2 \cdot Ic)$$

where $Vt = KT/q$, K is Boltzman's constant, T is temperature, q is electronic charge, and Ic is the quiescent current flowing through the emitters of transistors 2 and 4. This equation is valid for small values of Vout, but as the current being supplied to the load, 7, becomes large with respect to the quiescent current Ic, the output impedance starts to change dramatically. This change in output impedance changes the gain from input to output, thus causing a non-linearity in the transfer function of Vout vs. Vin. This nonlinearity in the transfer function is the biggest drawback to open loop buffers, limiting its usefulness to applications where accuracy is not important.

Figure 2:
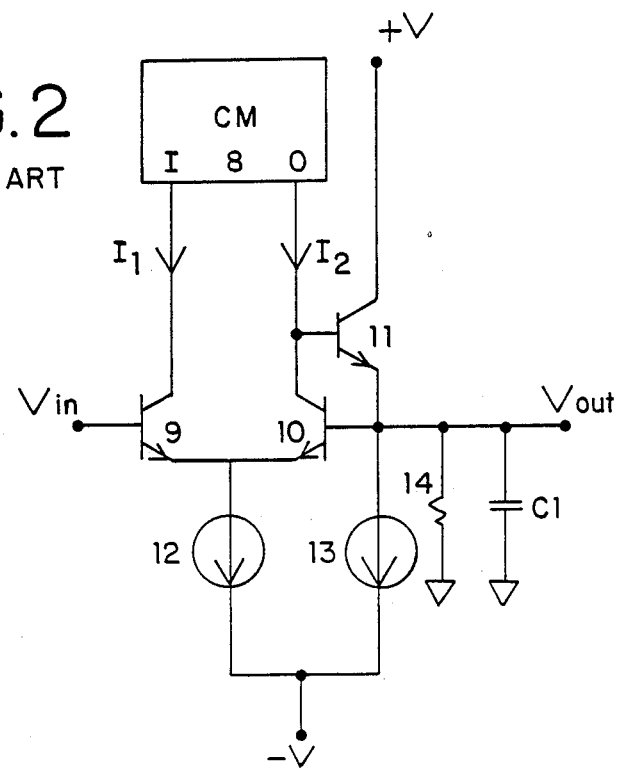
FIG. 2 illustrates a prior art closed loop buffer amplifier.

In FIG. 2 there is shown a circuit known in the art which utilizes a closed loop configuration to improve the accuracy of the buffer. Transistors 9 and 10 form a differential pair and, along with current mirror 8, form a differential gain block with output at the collector of transistor 10 and whose inputs are the bases of transistors 9 and 10. The current mirror can be constructed by any of the known means, and has the relationship that the output current, I2, is equal to the input current, I1, times a scale factor α. In this configuration, α is equal to 1. For a more complete description of current mirrors and their characteristics, see *Analysis and Design of Analog Integrated Circuits*, by Paul R, Gray and Robert G. Meyer, 2nd Edition, incorporated herein by reference.

Transistor 11, biased on by current source 13, is used to provide current to the load 14. The closed loop configuration is achieved by the connection of the emitter of transistor 11, which is the output of the buffer, to the base of transistor 10, which is one input of the gain block. Thus as the input, Vin, is increased, the voltage at the collector of transistor 10 is also increased due to the action of the differential pair and current mirror 8. As this voltage is increased, the emitter of transistor 11 tracks this voltage and feeds this signal back to the base of transistor 10. This then starts to decrease the voltage at the collector of transistor 10, and the output settles to a value that is equal to the input voltage. Since this feedback controls the output signal, Vout, the amount of current drawn through transistor 11 into the load 14 only has a secondary effect on the transfer function of Vout vs. Vin. Thus this closed loop buffer has much better linearity than the open loop buffer, but suffers in performance in several important respects.

Looking at the output stage of this buffer, which consists of transistor 11 and current source 13, it can be seen that the output current available to the load 14 is supplied by transistor 11 when the output goes positive, and by current source 13 when the output goes negative. For negative output voltage swings the output drive capability much less than that for positive output voltage swings. This drawback can be overcome somewhat by increasing the value of current source 13, but this increases the quiescent power dissipation and is usually unacceptable.

One other consequence of this unsymmetric output drive capability appears when driving capacitive loads. The slew rate at the output is equal to the amount of current available at the output of the buffer, divided by the value of the load capacitance. For negative going transitions, the slew rate (S.R.) is equal to $$S.R. = I13/C1$$

where C1 is the load capacitance and I13 is the current through current source 13. For positive going transitions, the amount of current available for charging the capacitance comes from the emitter of transistor 11, and this is normally several times that of the current source 13. Thus the unsymmetric output stage degrades the dynamic performance of this buffer.

Another drawback is the D.C. accuracy, particularly the offset voltage and bias current at the input. Since transistors 9 and 10 are not operating at the same collector-emitter voltage, the base-emitter voltage of transistor 9 is different than that of transistor 10 for equal collector currents in each transistor. This difference in base-emitter voltage is due to the Early effect, and results in the output voltage having a different DC level than the input voltage.

Also, the bias current at the input is equal to the base current of transistor 9, which can be quite large, depending on the value of current source 12 and the current gain of transistor 9. Thus this buffer also has performance limitations in the area of DC accuracy.

Figure 3:
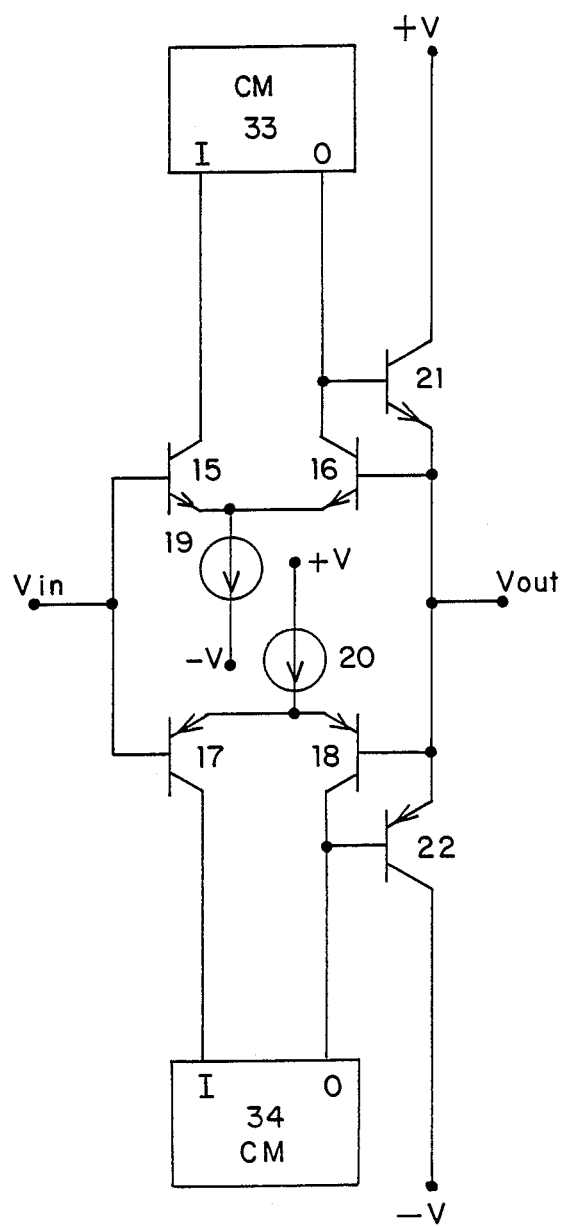
FIG. 3 represents a circuit topology which does not exhibit the features of the closed loop buffer amplifier of the invention.

To overcome the performance limitations due to the unsymmetric design of this buffer, one could create a symmetric version of this buffer by duplicating this circuit using PNP transistors and tying their common points together. This is shown in FIG. 3. The current source 13 in FIG. 2 is no longer needed since we now have a symmetric output stage resembling a Class AB push-pull amplifier. This eliminates the dynamic performance degradation due to the unsymmetric and limited output drive capability of FIG. 2. This topology also improves the DC accuracy of the buffer. The offset voltage that is due to the Early effect between transistors 15 and 16 is reduced by the mismatch in base-emitter voltage of transistors 17 and 18 due to the Early effect. It will be shown that if transistors 15, 16, 17 and 18 all have the same Early voltage, the offset is reduced to zero. Also, the bias current at the input is now equal to the base current of transistor 15 minus the base current of transistor 17. For equal values of current gain in transistors 15 and 17, and equal bias currents of current sources 19 and 20, the input bias current is also equal to zero.

Unfortunately, the circuit shown in FIG. 3 has one critical problem. Since the collectors of transistors 16 and 18 are high impedance nodes, the quiescent voltage difference between the bases of transistors 21 and 22 is poorly defined. This implies that the quiescent current through transistors 21 and 22 is also poorly defined, since this quiescent current is dependent upon the voltage difference between the bases of transistors 21 and 22.

What is needed is a circuit that allows for proper biasing of transistors 21 and 22 yet does not degrade the performance of the circuit. Reducing the impedance at the collectors of transistors 16 and 18 will help control the quiescent current through transistors 21 and 22, but this will reduce the loop gain of the buffer and degrade its performance.

Figure 4:
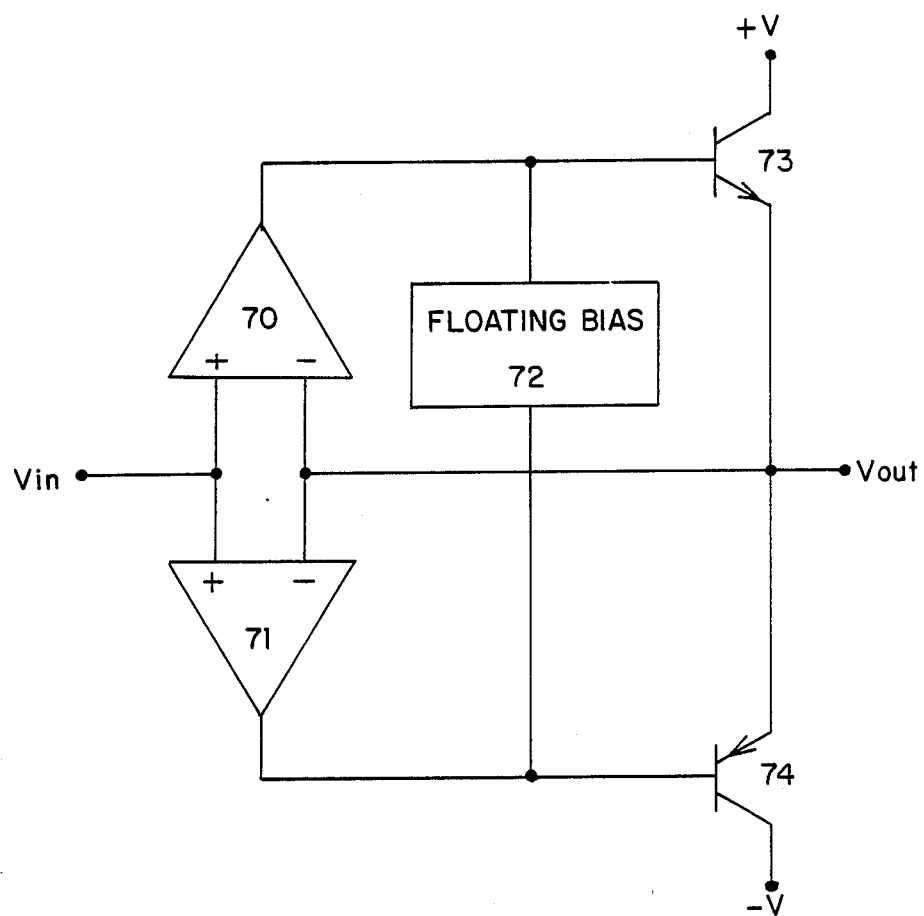
FIG. 4 is a general circuit diagram of the closed loop buffer amplifier of the invention.

In FIG. 4 there is shown the most general form of closed loop amplifier of the invention. This comprises two differential gain blocks, labeled 70 and 71, a floating bias 72, and output stage transistors 73 and 74. The differential gain blocks obey the relationship that the output voltage is equal to the difference between the two input voltages, multiplied by the differential gain, Ad. Floating bias 72 is that part of the invention which allows for proper biasing of the output stage transistors 73 and 74. It maintains a constant voltage between its external connections, and provides a low impedance path for any differential signal appearing across its terminals. Ideally then this floating bias could be thought of as an ideal voltage source. The collectors of the output stage transistors 73 and 74 are tied to bias means to allow for proper biasing of the transistors.

Figure 5:
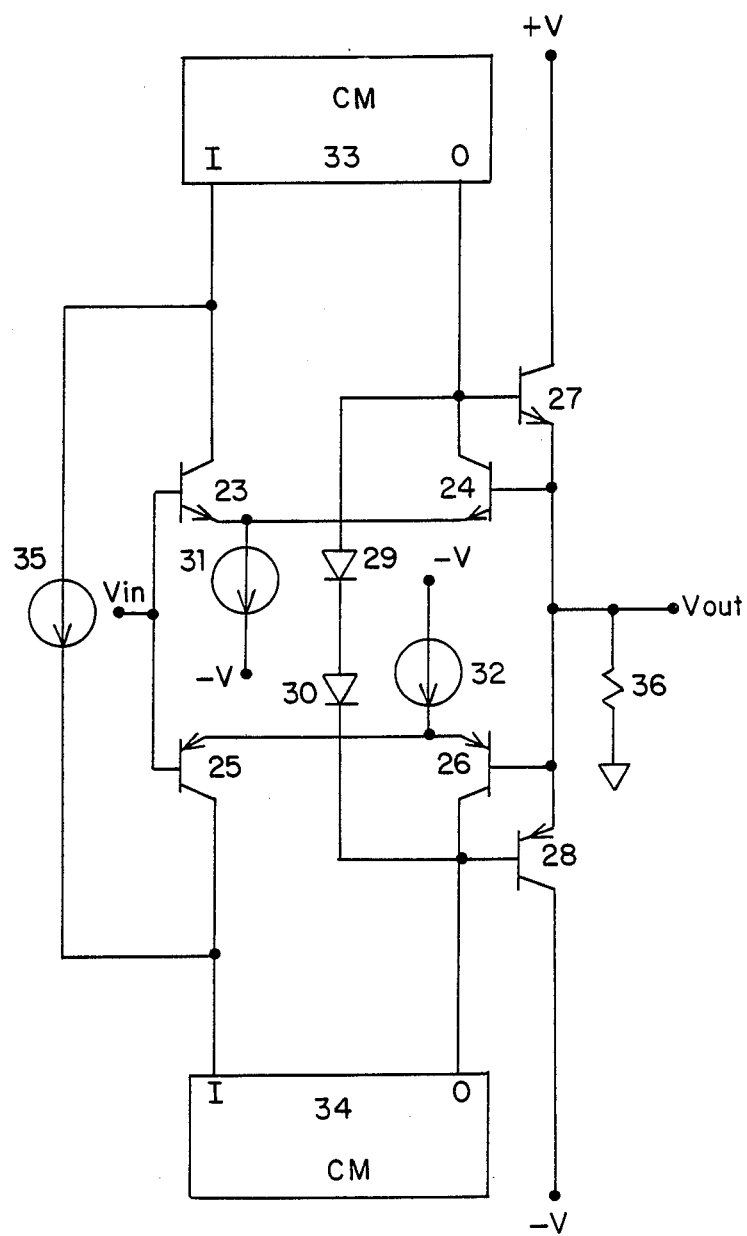
FIGS. 5, 6, 7 and 8 are circuit diagrams of various embodiments of the amplifiers of this invention.

In FIG. 5 is shown the preferred embodiment of the invention. Transistors 23 and 24, and current mirror 33 form a differential gain block with output at the collector of transistor 24, and whose inputs are the bases of transistors 23 and 24. Transistors 25 and 26, and current mirror 34, form another differential gain block whose output is at the collector of transistor 26, and whose inputs are the bases of transistors 25 and 26. Transistors 27 and 28 are used to buffer these high impedance nodes, and their emitters are tied together to form the output of the buffer, and a unity gain feedback to the inverting input of the differential pairs. Diodes 29 and 30 and current source 35 provide the means to allow proper biasing of transistors 27 and 28. The operation of the circuit will now be discussed in detail.

Current source 31 provides current for differential pair transistors 23 and 24. With current mirror 33 having a current gain of 1, and neglecting the base current of transistor 27 and the Early effect, the bias current from current source 31 splits equally with half the current flowing through transistor 23 and the other half flowing through transistor 24. The negative feedback of this part of the circuit, which comes from the connection of the emitter of transistor 27 to the base of transistor 24, assures this equal splitting of the bias current. To see how this is true, assume that more current starts to flow through transistor 23 and thus less current through transistor 24. This means that the output current coming from current mirror 33 is greater than the collector current of transistor 24. Since the collector of transistor 24 is a high impedance node, this extra current forces the voltage at the collector of transistor 24 to increase. This increase in voltage is fed back, through transistor 27, to the base of transistor 24, causing the current in transistor 24 to increase and the current in transistor 23 to decrease, until they are both equal again.

The complementary half of the circuit, consisting of current source 32, differential pair transistors 25 and 26, current mirror 34, and output transistor 28, functions in the same manner as the top half of the circuit, except that all polarities are reversed.

The function of diodes 29 and 30, and current source 35 is now explained. Current source 35 increases the current that is flowing into the inputs of current mirrors 33 and 34. This will then increase the output currents of current mirrors 33 and 34. It has been shown above that the negative feedback of the circuit provides that the current through transistors 23 and 24 be equal, and the current through transistors 25 and 26 be equal. Thus the extra current that is flowing out of the current mirrors is forced to flow through diodes 29 and 30. This creates a voltage between the bases of transistors 27 and 28, and creates the bias network for transistors 27 and 28. It is a simple matter to use a diode whose voltage vs. current characteristics match that of a transistor base-emitter voltage vs. collector current characteristics. Choosing diode 29 to match transistor 27 in this concern, and choosing diode 30 to match transistor 28, then, neglecting the Early effect, the quiescent current through transistors 27 and 28 is equal to current flowing through diodes 29 and 30, which is equal to the current in current source 35.

Thus these diodes allow for proper biasing of output transistors 27 and 28, while at the same time leaving the performance of the gain stages alone. This is seen by applying a positive voltage to the input. This initially forces the voltage on the collectors of both transistors 24 and 26 to increase. Since this voltage increase is the same on each collector, assuming all transistors are matched, then the voltage drop across the diodes remains constant, allowing proper biasing of transistors 27 and 28, and thus has no effect on the dynamic performance of the circuit. Diodes 29 and 30 provide a floating bias to output transistors 27 and 28, wherein a constant delta voltage centered about the desired output voltage is maintained.

Diodes 29 and 30 also provide another important function. Due to the Early effect, transistors 24 and 26 will necessarily have less current flowing through them than transistors 23 and 25. This implies that there is an excess of current flowing out of current mirror 33 and into current mirror 34. Diodes 29 and 30 now provide a path for this excess current to flow, again without disturbing the dynamic performance of the buffer.

In FIG. 5 diodes 29 and 30 are biased on by the current source 35 providing extra current to current mirrors 33 and 34. There are many other possible ways to provide bias current to diodes 29 and 30, such as using independent current sources connected from the supplies to the collectors of transistors 24 and 26. There are also many other methods in the art to allow proper biasing of diodes 29 and 30, and it is not necessary to describe them all to understand the invention.

Since this invention uses negative feedback to obtain the improved performance, a discussion of the stability and compensation techniques is required. As with most feedback amplifiers, the open loop frequency response contains a dominant, low frequency pole and several higher frequency poles, which in reality determine the maximum bandwidth attainable under negative feedback.

To simplify the discussion, consider the half circuit consisting of transistors 23 and 24, current mirror 33, output transistor 27, and load 36. The dominant pole is determined by the impedance at the collector of transistor 24. This impedance consists of the parallel combination of several constituent impedances, which are the output impedance of transistor 24, the output impedance of current mirror 33, and the input impedance looking into the base of transistor 27, which is in part determined by the load resistor 36.

There also appears at this node an equivalent shunt capacitance, which is determined by the capacitors connected to this diode, whether coming from the transistors themselves, or are just strays. This equivalent shunt capacitance, in parallel with the equivalent impedance, determines the location of the dominant pole.

The higher frequency poles have many contributing factors, most of which are due to the finite current gain-bandwidth product of the transistors. This also applies to the current mirror 33, since it is constructed using transistors, and thus has an upper limit on its frequency response.

The stability and performance of feedback systems depend, to a large extent, on open loop again, open loop bandwidth, and the location of the second order, higher frequency poles. To compensate negative feedback systems, the usual methods are to reduce open loop gain, reduce the frequency of the open loop pole, increase the frequency of the second order poles, or some combination of these.

Figure 6:
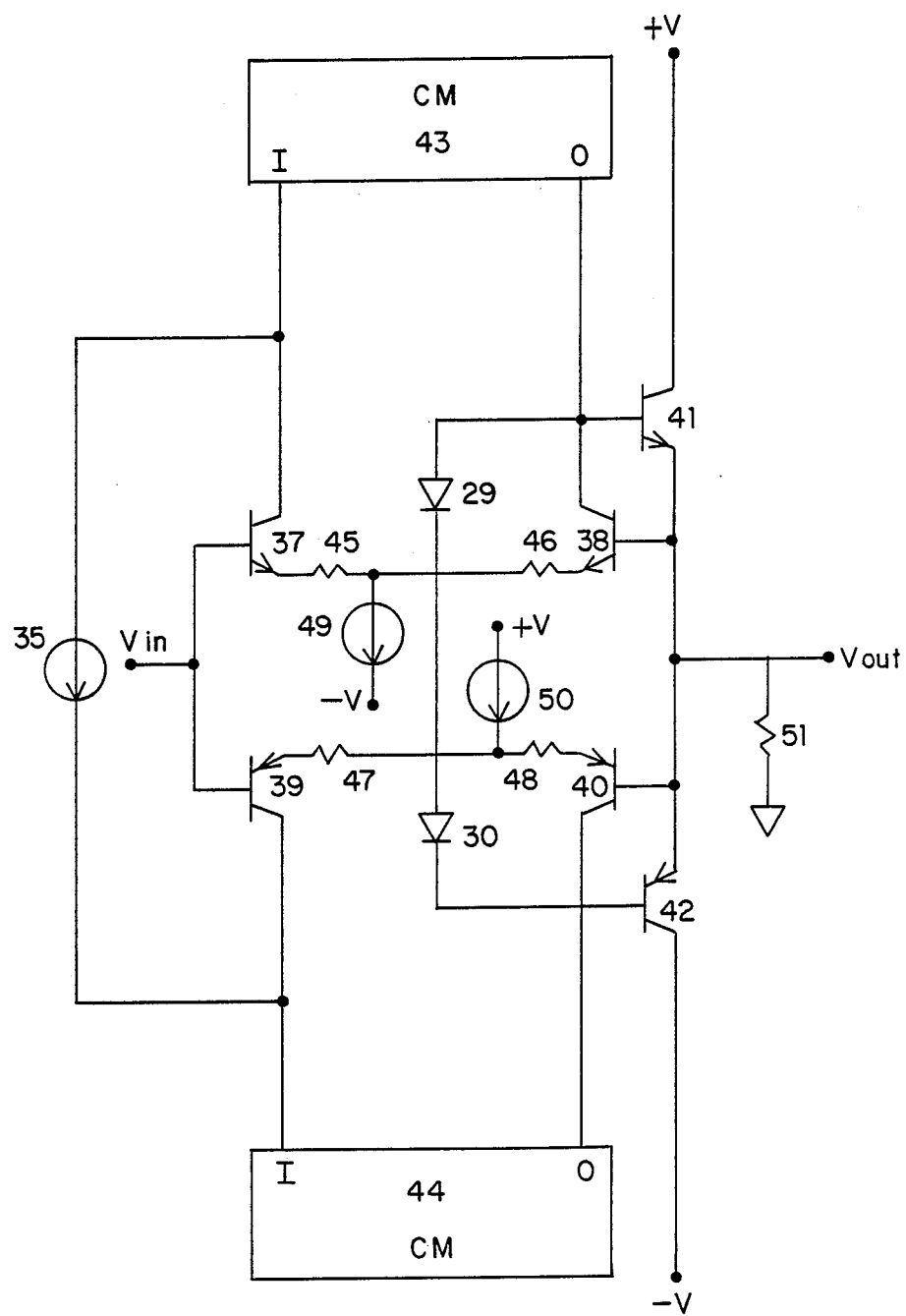

In FIG. 6 there is shown an amplifier of the invention employing a preferred embodiment of compensation. This is accomplished by adding resistors in series with the emitters of the input stage transistors. These emitter resistors are shown as resistors 45, 46, 47 and 48. These resistors compensate the invention in two areas. First, these resistors reduce the gain of the input stage, which in turn reduces the open loop gain. Secondly, these resistors will increase the frequency response of the input stage, thus increasing the frequency of one of the second order poles of the circuit.

Figure 7:
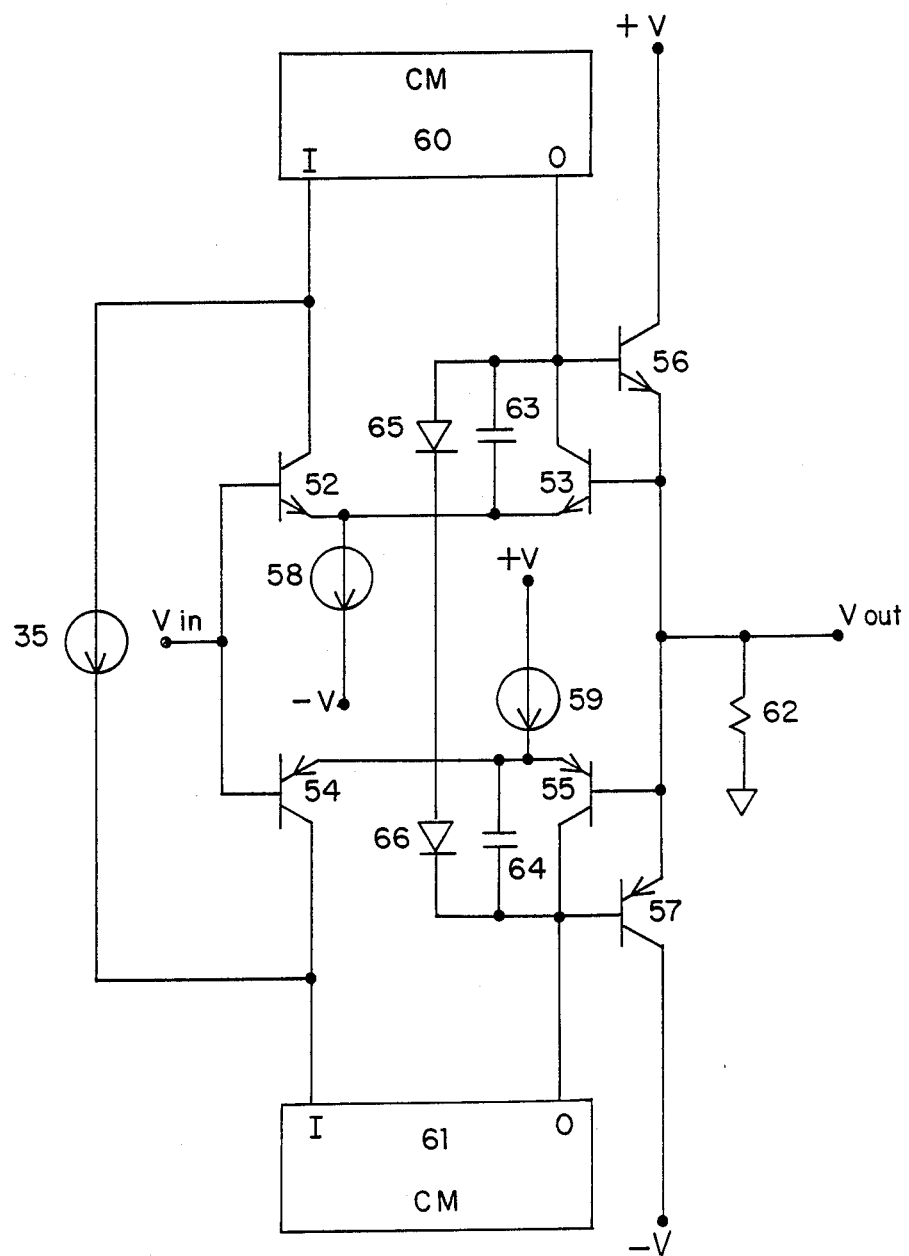

A second way to compensate the circuit is by adding more shunt capacitance at the high impedance nodes. This will decrease the frequency of the open loop pole of the circuit. One implementation of this is shown in FIG. 7. Capacitors 63 and 64 are connected from the high impedance nodes to the emitters of the input stage, which are low impedance nodes. In general, these capacitors can be connected to any low impedance node, including the power supplies or ground, and will perform the same function of reducing the frequency of the open loop pole.

Figure 8:
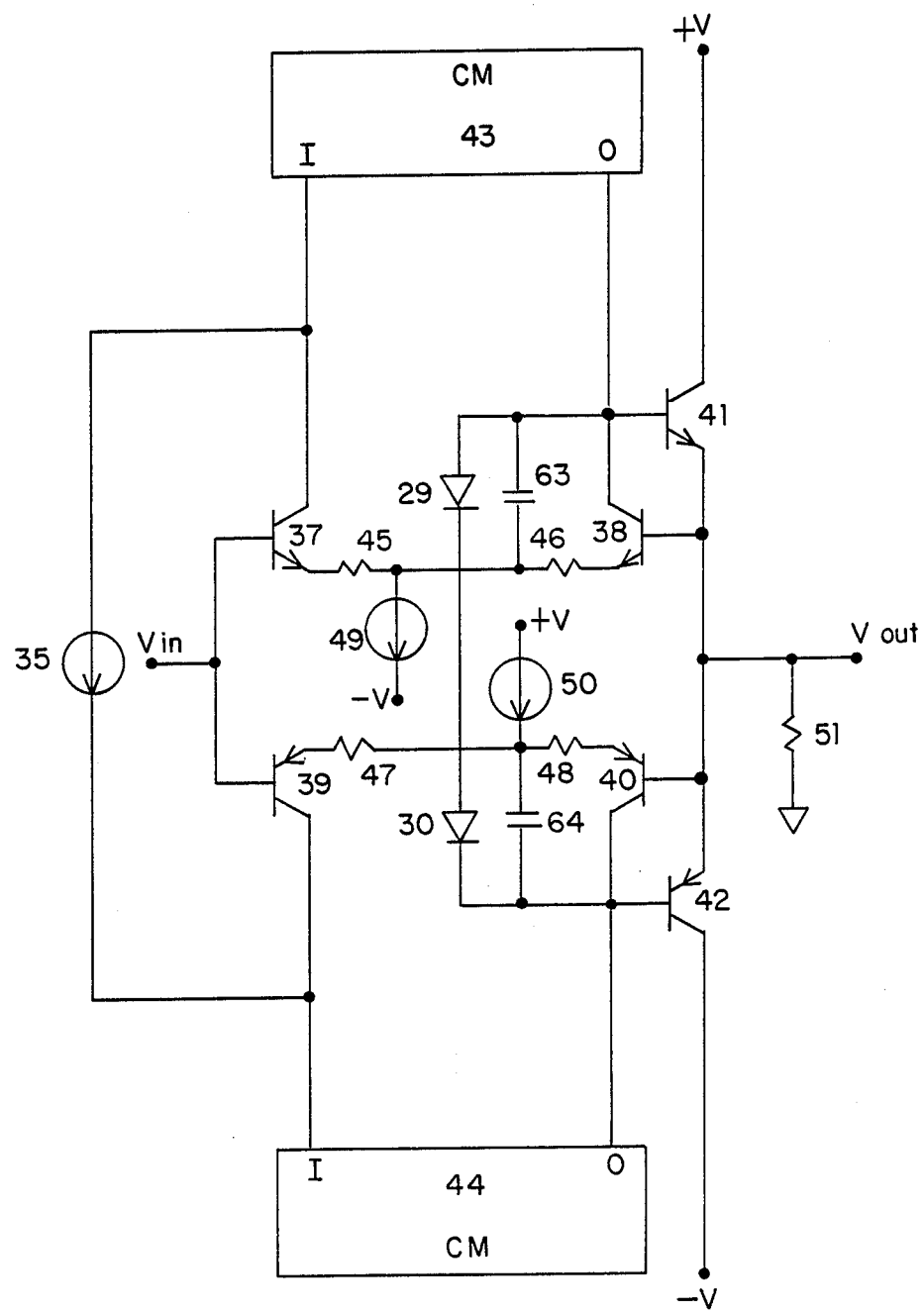

Also, any combination of these two methods of compensation can be used. Thus, adding emitter resistors as shown in FIG. 6, and adding shunt capacitance as shown in FIG. 7, will together provide a means for compensation. This is shown in FIG. 8.

It is thus shown that the invention is a closed loop buffer amplifier having all the advantages of prior art closed loop buffer amplifiers, particularly high dynamic and DC accuracy, yet also has some of the desired qualities of open loop buffer amplifiers, particularly symmetric output drive capability, good input characteristics, and wide bandwidth. Thus this design is shown to be superior to prior art open loop and closed loop buffer amplifiers.

The embodiments of the present invention have been described above in terms of NPN and PNP bipolar transistors. However, other embodiments based upon other types of transistors, and other slight modifications of the devices taught herein, will be immediately clear to one skilled in the art of circuit design. These other transistor devices include, but are not limited to, junction field-effect transistors (JFETS), insulated gate field effect transistors (FETS) of either enhancement or depletion mode, MESFETS, vacuum tubes of any number of elements, and devices compounded of simpler transistor devices, such as Darlington transistors, parallel transistors, and diode-connected transistors.

For the purposes of this invention and the appending claims, reference to "transistor" shall include any electronic devices, simple or compound, having at least common, input, and output terminals, and constructed so that a current flowing through said output terminal to said common terminal is responsive to a voltage difference existing at said input terminal with respect to said common terminal. Additionally, reference herein to "emitter", "base", and "collector" terminals of said transistor shall be construed to apply to said common, input, and output terminals of said electronic device. For example, a field-effect transistor includes gate, source and drain terminals which correspond, respectively, to the base, emitter and collector terminals of a bipolar transistor.

Additionally, as used herein, the term "diode" includes any electronic device having at least common and input terminals, and which is constructed such that the voltage-current characteristic of said common terminal with respect to said input terminal matches the voltage-current characteristic of the common terminal with respect to the input terminal of a transistor.

What is claimed is:

1. A closed loop buffer amplifier having an input terminal and an output terminal, said amplifier comprising:
   (a) first and second differential amplifiers, each of which includes an inverting input and a non-inverting input and an output;
   (b) floating bias means connected between said output terminals of said first and second differential amplifiers;
   (c) an output stage comprising first and second output transistors each having base, emitter and collector terminals;
   (d) first and second bias sources; wherein said first bias source is connected to said collector terminal of said first output transistor; wherein said second bias source is connected to said collector terminal of said second output transistor;
wherein said non-inverting inputs of said first and second differential amplifiers are connected together to form said input terminal of said closed loop buffer amplifier; wherein said inverting inputs of said first and second differential amplifiers are connected together to form said output terminal of said closed loop buffer amplifier; wherein said emitter terminals of said first and second output transistors are connected to said output terminal of said closed loop buffer amplifier; wherein said output of said first differential amplifier is connected to said base terminal of said first output transistor; and wherein said output of said second differential amplifier is connected to said base terminal of said second output transistor.

2. A closed loop buffer amplifier in accordance with claim 1, wherein said floating bias means comprises first and second diodes connected together in series.

3. A closed loop buffer amplifier in accordance with claim 1, wherein each said differential amplifier comprises first and second transistors, a current source adapted to bias on said transistors, a current mirror having input and output terminals; wherein each said transistor has base, emitter and collector terminals; wherein said base terminal of said first transistor in each said differential amplifier forms said non-inverting input of said differential amplifier; wherein said collector terminal of said first transistor is connected to said input terminal of said current mirror; wherein said emitter terminals of said first and second transistors of said differential amplifier are connected together; wherein said base terminal of said second transistor forms said inverting input of said differential amplifier; wherein said collector terminal of said second transistor is connected to said output terminal of said current mirror and forms said output of said differential amplifier; and wherein said current source in each said differential amplifier is connected to said emitter terminals of said first and second transistors in each said differential amplifier.

4. A closed loop buffer amplifier in accordance with claim 3, wherein said floating bias means comprises (a) first and second diodes connected together in a series, and (b) current means for supplying bias current, said current means being connected between said inputs of said first and second current mirrors of said first and second differential pairs.

5. A closed loop buffer amplifier in accordance with claim 4, further comprising resistors connected between said emitter terminals of said first and second transistors in each said differential amplifier.

6. A closed loop buffer amplifier in accordance with claim 4, further comprising a capacitor connected between said output terminal of said differential amplifier and said emitter terminal of said first transistor in each said differential amplifier.

7. A closed loop buffer amplifier in accordance with claim 6, further comprising resistors connected between said emitter terminals of said first and second transistors in each differential amplifier.

8. A closed loop buffer amplifier having an input terminal and an output terminal, said amplifier comprising:
   (a) first and second differential pairs, each of which includes non-inverting and inverting inputs and positive and negative outputs;
   (b) first and second current mirrors each having input and output terminals;
   (c) floating bias means connected between said positive output of said first differential pair and said positive output of said second differential pair;
   (d) an output stage comprising first and second output transistors each having base, emitter and collector terminals;
   (e) first and second bias means adapted to bias said output transistors;
wherein said input terminal of said first current mirror is connected to said negative output of said first differential pair; wherein said output terminal of said first current mirror is connected to said positive output of said first differential pair; wherein said input terminal of said second current mirror is connected to said negative output of said second differential pair and wherein said output terminal of said second current mirror is connected to said positive output of said second differential pair; wherein said non-inverting inputs of said first and second differential pairs are connected together to form said input terminal of said closed loop buffer amplifier; and wherein said inverting inputs of said first and second differential pairs are connected together with said emitter terminals of said first and second output transistors to form said output terminal of said closed loop buffer amplifier; wherein said base terminal of said first output transistor is connected to said positive output of said first differential pair; wherein said base terminal of said second output transistor is connected to said positive output of said second differential pair; and wherein said collector terminal of said first output transistor is connected to said first bias means for proper biasing of said first output transistor; wherein said collector terminal of said second output transistor is connected to said second bias means for proper biasing of said second output transistor.

9. A closed loop buffer amplifier in accordance with claim 8, wherein each said differential pair includes first and second transistors and a current source adapted to bias on said transistors; wherein each said transistor has base, emitter, and collector terminals; wherein said base terminal of said first transistor in each said differential pair forms said non-inverting input of said pair; wherein said collector terminal of said first transistor forms said negative output of said pair; wherein said emitter terminals of said first and second transistors of said pair are connected together; wherein said base terminal of said second transistor forms said inverting input of said pair; wherein said collector terminal of said second transistor of said pair forms said positive output of said pair; and wherein said current source in each said pair is connected to said emitter terminals of said first and second transistors in each said pair.

10. A closed loop buffer amplifier in accordance with claim 8, wherein said floating bias means comprises (a) first and second diodes connected together in a series, and (b) current means for supplying bias current, said current means being connected between said negative outputs of said first and second differential pairs.

11. A closed loop buffer amplifier in accordance with claim 10, further comprising resistors connected between said emitter terminals of said first and second transistors in each said differential pair.

12. A closed loop buffer amplifier in accordance with claim 10, further comprising a capacitor connected between said positive output terminal of said differential pair and said emitter terminal of said first transistor in each said differential pair.

13. A closed loop buffer amplifier in accordance with claim 12, further comprising resistors connected between said emitter terminals of said first and second transistors in each differential amplifier.

* * * * *